United States Patent
Hinks et al.

(10) Patent No.: US 6,294,913 B1
(45) Date of Patent: Sep. 25, 2001

(54) COMPENSATION OF VARIATIONS IN POLARIZING MAGNETIC FIELD DURING MAGNETIC RESONANCE IMAGING

(75) Inventors: Richard Scott Hinks, Waukesha; Robert A. Kraft, Menomonee Falls; Saban Kurucay, Waukesha, all of WI (US)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 09/447,395

(22) Filed: Nov. 22, 1999

(51) Int. Cl.[7] ........................................... G01V 3/00
(52) U.S. Cl. ............................................. 324/309
(58) Field of Search .................... 324/309, 307, 324/306, 314, 300

(56) References Cited

U.S. PATENT DOCUMENTS

| | | | |
|---|---|---|---|
| 4,646,046 | 2/1987 | Vavrek et al. | 335/301 |
| 4,698,591 | 10/1987 | Glover et al. | 324/307 |
| 4,970,457 | * 11/1990 | Kaufman et al. | 324/309 |
| 5,289,127 | 2/1994 | Doddrell et al. | 324/314 |
| 5,488,950 | 2/1996 | Ehnholm | 128/653.1 |
| 5,770,943 | 6/1998 | Zhou | 324/307 |
| 5,952,734 | 9/1999 | Gelbien | 307/91 |

* cited by examiner

*Primary Examiner*—Louis Arana
(74) *Attorney, Agent, or Firm*—Quarles & Brady, LLP; Christian G. Cabou

(57) ABSTRACT

Monitor signals are acquired in an interleaved manner during a scan with an MRI system. Frequency changes caused by variations in the polarizing magnetic field $B_0$ are measured using the monitor signals, and these measured frequency changes are employed to compensate image data acquired during the scan.

15 Claims, 4 Drawing Sheets

COMPENSATION OF VARIATIONS IN POLARIZING MAGNETIC FIELD DURING MAGNETIC RESONANCE IMAGING

BACKGROUND OF THE INVENTION

The field of the invention is nuclear magnetic resonance imaging ("MRI") methods and systems. More particularly, the invention relates to the removal of artifacts in MR images produced by changes in the polarizing magnetic field during the acquisition of data.

When a substance such as human tissue is subjected to a uniform magnetic field (polarizing field $B_0$), the individual magnetic moments of the spins in the tissue attempt to align with this polarizing field, but precess about it in random order at a characteristic Larmor frequency which is determined by the gyromagnetic constant $\gamma$ of the spins and the polarizing magnetic field $B_0$. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this NMR signal may be received and processed to form an image.

When utilizing these signals to produce images, magnetic field gradients ($G_x$ $G_y$ and $G_z$) are employed. Typically, the region to be imaged is scanned by a sequence of separate measurement cycles (referred to as "views") in which these gradients vary according to the particular localization method being used. The resulting set of received NMR signals are digitized and processed to reconstruct the image using one of many well-known reconstruction techniques.

A well-known problem with MRI systems is variations in the strength of the polarizing magnetic field $B_0$. Such variations affect acquired images in two ways. First, changes in $B_0$ cause corresponding changes in the phase of the acquired NMR signals. Such spurious phase changes appear in the acquired NMR signals, or "k-space data", and result in ghosting or blurring artifacts in an image reconstructed using the Fourier transformation method. Since the spurious phase shift accumulates continuously between RF excitation and data acquisition, the artifacts are particularly troublesome with gradient recalled echo pulse sequences having a long echo time, TE. Changes in $B_0$ can also cause apparent spatial shifts along the frequency encoding (i.e. readout) gradient direction.

The second deleterious effect of changes in polarizing magnetic field $B_0$ occurs when slice selection techniques are used in the pulse sequence. The change in $B_0$ shifts the location of the excited slice by an amount equal to the change in Larmor frequency divided by the bandwidth of the selective RF excitation pulse. For example, if $B_0$ shifts the Larmor frequency by 20 Hz and the selective RF excitation pulse has a bandwidth of 1000 Hz, the excited slice will shift 2% from its expected position along the slice select gradient axis. Such shifts can cause amplitude changes in the acquired data.

Many methods are used to control and regulate the polarizing magnetic field $B_0$. Most of these methods deal with changing conditions within the scanner itself and are quite effective. For example, methods for compensating the effects on $B_0$ due to Eddy currents produced by changing magnetic field gradients are disclosed in U.S. Pat. Nos. 4,698,591; 5,289,127; and 5,770,943.

Polarizing magnetic field strength $B_0$ is affected by external events such as the movement of large masses of metal in the vicinity of the scanner. Moving objects such as cars, trucks, trains and elevators can change the polarizing magnetic field and produce image artifacts.

Two methods have been used to reduce the effects of such disturbances, passive methods and active methods. Passive methods include the use of shielding materials around the main magnet as described, for example, in U.S. Pat. No. 4,646,046. Massive amounts of silicon steel sheets are placed around the magnet, which results in an expensive, heavy and difficult to install system.

Active compensation systems employ a sensor which measures the change in magnetic flux at a location near the scanner and uses this information to compensate the system. Such compensation may include producing a current in a coil that generates an offsetting correction magnetic field. Such methods employ flux sensors as described, for example, in U.S. Pat. No. 5,952,734 or ESR instruments as disclosed in U.S. Pat. No. 5,488,950. These active methods do not work well when the field disturbance is produced by multiple sources or sources of varying magnitude or location.

SUMMARY OF THE INVENTION

The present invention compensates for changes that occur in the polarizing magnetic field of an MR system due to disturbances such as the movement of large metal objects in the vicinity of the MR system. More particularly, monitor signals are acquired with the MR system as it performs a scan, frequency changes in the monitor signals due to changes in the polarizing magnetic field strength are detected, and these detected frequency changes are used to compensate the acquired NMR image or spectroscopic data. In one embodiment compensation is achieved prospectively by changing the frequency of the RF transmitter and receiver to offset the effects of changes in $B_0$, and in a second embodiment compensation is achieved retrospectively by changing the phase of the acquired k-space data to offset the effects of changes in $B_0$.

DESCRIPTION OF THE PREFERRED EMBODIMENT

Figure 1:
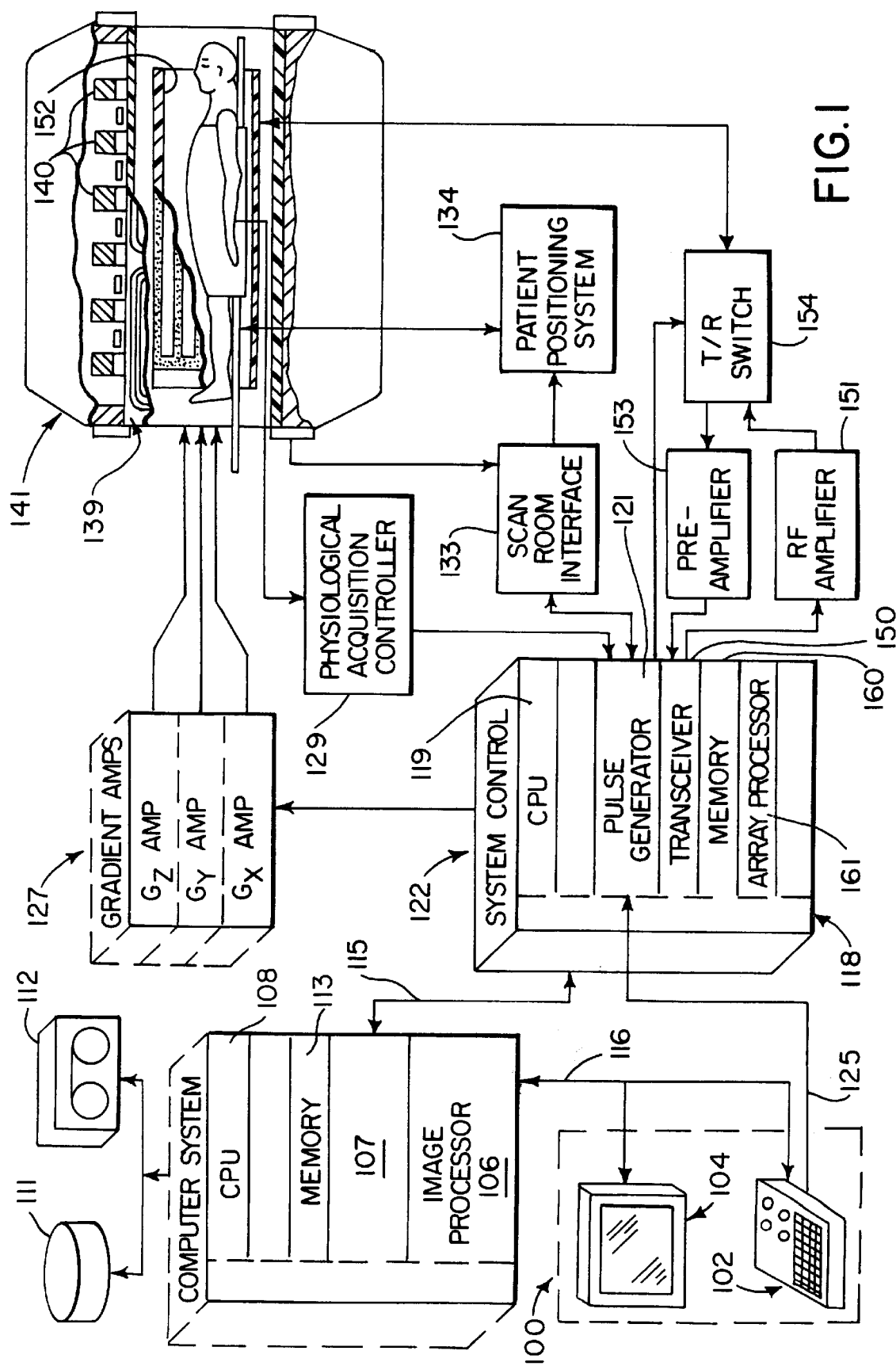
FIG. 1 is a block diagram of a known MRI system which has been modified to practice the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
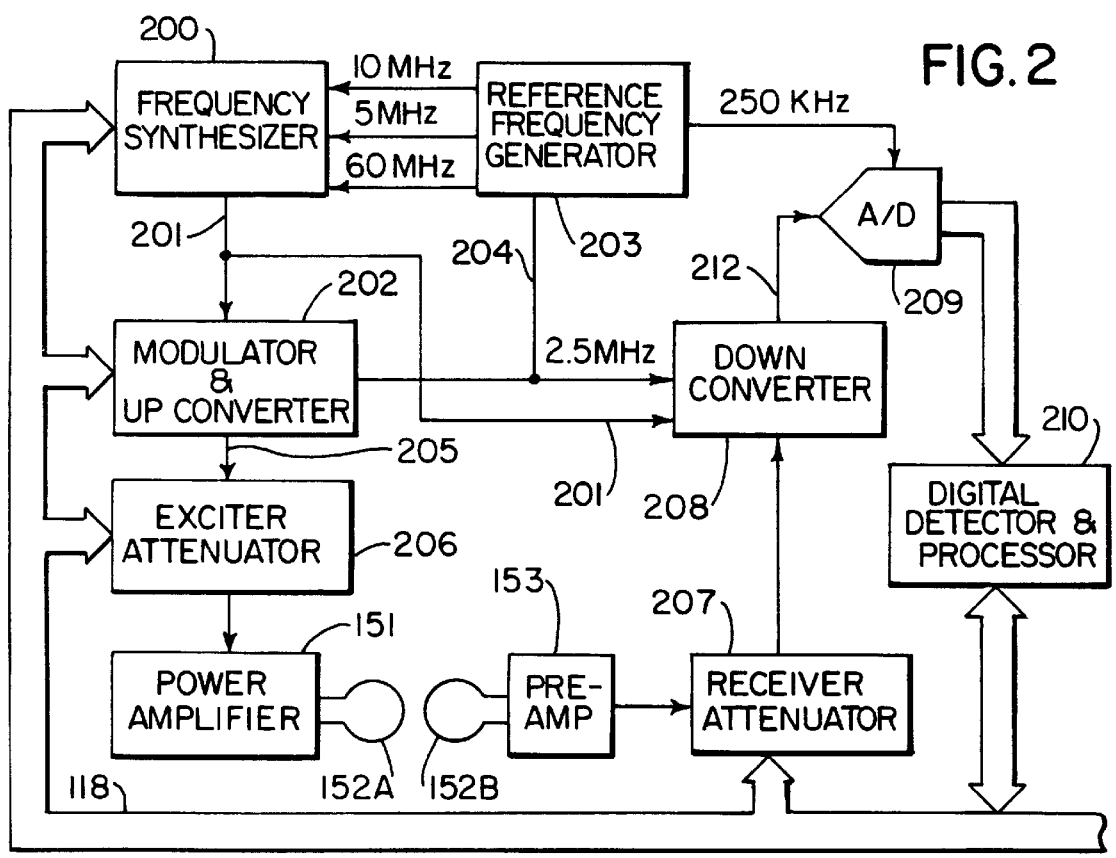
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. As described above, the phase of the carrier signal on line 201 is controlled by the frequency synthesizer 200 in response to a phase command received from the pulse generator module 121. To practice the preferred embodiment of the present invention, this phase command is changed during the acquisition of data to offset, or compensate for changes in the polarizing magnetic field strength.

The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Moving metal (car, truck, elevator, train, etc.) which passes near the MRI system causes the polarizing magnetic field strength to change as a function of time $B_0(t)$. The $B_0(t)$ variations from moving objects tends to be a low frequency function wherein the field $B_0$ changes smoothly over the course of 0.5 to 2.0 seconds. A peak displacement from the baseline $B_0$ may vary from a few Hz (cars) to tens of Hz (trucks and larger). This variation in $B_0$ is much slower than the fluctuations observed from magnet vibration (1–100 Hz), leading to the observation that these slower $B_0$ fluctuations may be compensated by measuring $B_0$ with monitor echoes and compensating the observed frequency changes either prospectively (frequency shift of the transceiver reference frequency) or retrospectively during image reconstruction.

The changing $B_0(t)$ caused by moving metal objects produces phase shifts in the acquired NMR signals S(t). The NMR signal S(t) accumulates spurious phase shifts that show up in the raw k-space data and cause ghosting or blurring artifacts in the reconstructed image. Phase shifts $\Delta\phi$ accumulate as the integral of $B_0(t)$, or $\Delta\phi=\gamma \int \Delta B_0(t)dt$. These phase shifts accumulate continuously during the performance of a gradient recalled echo imaging pulse sequence, starting with the application of the RF excitation pulse and extending to data acquisition. Gradient echo scans are thus very sensitive to moving metal particularly at long TE times.

The present invention compensates for moving metal variations in $B_0$ by measuring the frequency of a monitor NMR signal periodically during the scan and using that information to compensate the NMR data being acquired during the scan. In a first preferred embodiment of the invention these monitor NMR signals are produced by a separate monitor pulse sequence illustrated in FIG. 3. This monitor pulse sequence is interleaved with the imaging pulse sequences such that an NMR monitor signal is acquired every 50 to 100 msecs. during the scan. As will be described below, the acquired NMR monitor signals are processed and used to adjust the reference frequency employed in the transceiver 150.

Figure 3:
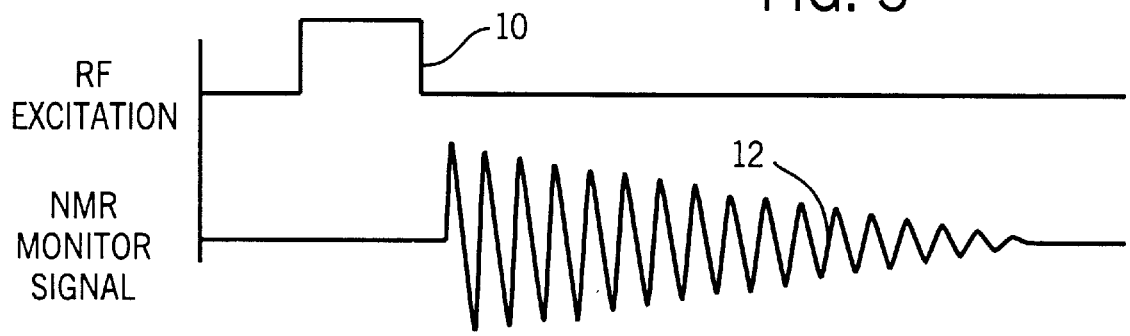
FIG. 3 is a graphic representation of a preferred embodiment of a monitor signal pulse sequence that may be employed in the MRI system of FIG. 1.

Referring particularly to FIG. 3, the monitor pulse sequence includes a non-selective RF excitation pulse 10 having a flip angle of 90° and a duration of 0.5 msec. The RF excitation pulse has a frequency set to correspond to the frequency of the spins from which the monitor signal will be acquired. After termination of the RF pulse 10, the system switches as fast as possible (approximately 200 µsecs.) to the receive mode and an NMR monitor signal 12 is acquired. A total of 256 samples of the monitor signal 12 are acquired at a rate of one sample every 16 µsecs. As explained above, the I and Q values of each sample are stored in memory.

With this method of acquiring the monitor signals it is preferable to use and excite a separate sample with a separate rf excitation coil. Such a sample and coil is disclosed in co-pending U.S. patent application Ser. No. 09/384,945 filed on Aug. 27, 1999. In the alternative, the monitor pulse sequence can be interleaved with the imaging pulse sequences and performed with the same hardware. In this case the flip angle of the rf excitation pulse is reduced to a very small value so as not to unduly affect the spin magnetization in the subject being imaged.

Figure 4:
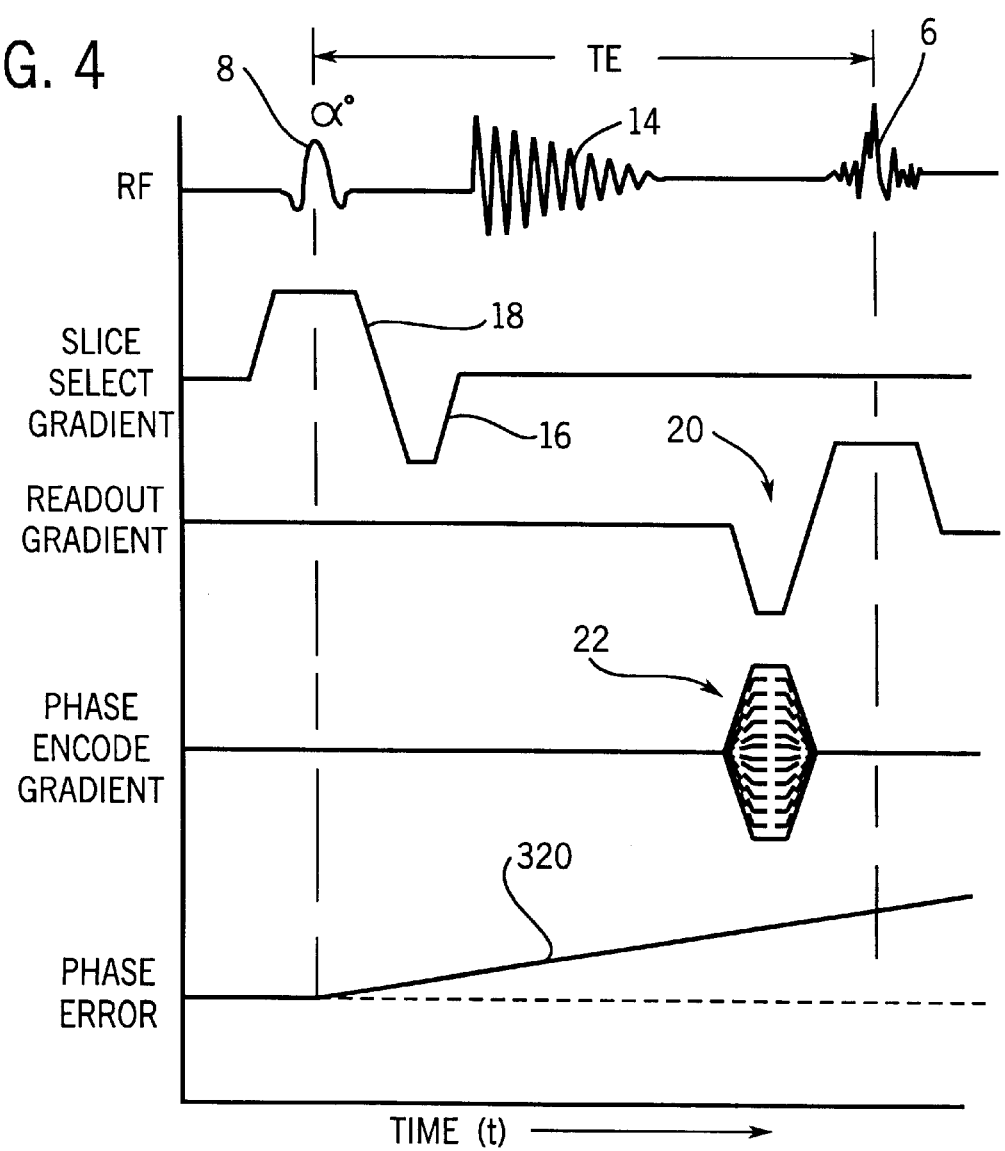
FIG. 4 is a graphic representation of a pulse sequence in which a monitor signal acquisition is incorporated into an imaging pulse sequence.

An alternative technique for acquiring NMR monitor signals is to incorporate the acquisition into the imaging pulse sequence being used during the scan. This is illustrated in FIG. 4, for example, which is a gradient recalled echo imaging pulse sequence modified to acquire an NMR monitor signal 14. The monitor signal 14 is acquired after the rf excitation pulse 8 is applied to produce transverse magnetization and immediately after the rephasing lobe 16 for a slice select gradient pulse 18. It is acquired prior to the application of a readout gradient 20 and a phase encoding gradient 22 which impart a phase shift to the transverse magnetization. The NMR echo signal 6 is thus acquired in a few milliseconds after acquisition of the monitor NMR signal 14. As is well known in the art, this pulse sequence is repeated during a scan and the phase encoding gradient 22 is stepped through a set of values to sample k-space. In this embodiment each acquired view, or sampled line of k-space, is accompanied by 256 samples of the NMR monitor signal 14 which was acquired at substantially the same moment during the scan. As will be explained in more detail below, the NMR monitor signal 14 provides an indication of the $B_0$ field strength at substantially the same moment in time its associated NMR echo signal 6 is acquired. It can be appreciated that because the variations in $B_0$ are relatively slow, substantially the same moment in time means within ±100 msecs. of the exact same moment in time.

Figures 5, 6:
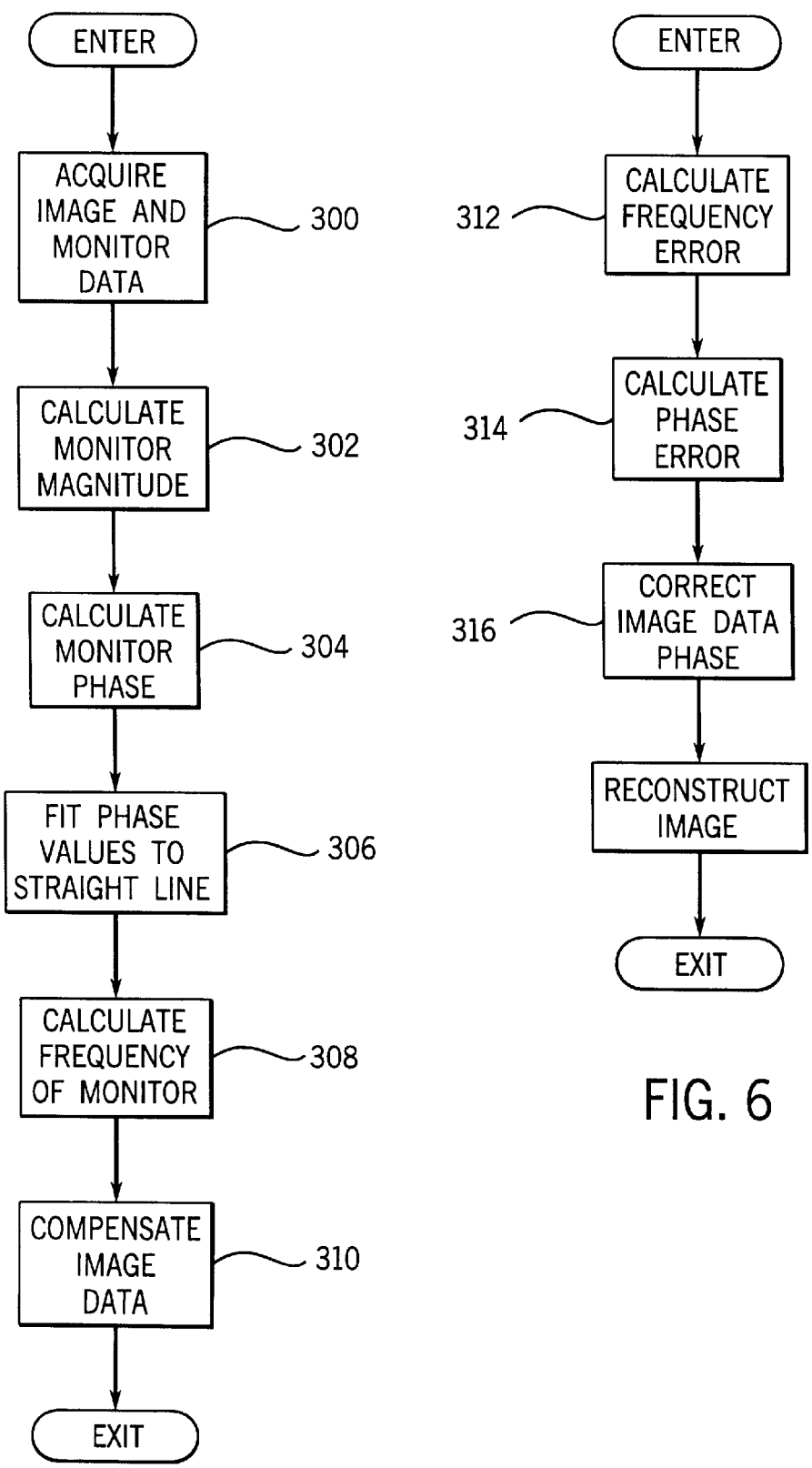
FIG. 5 is a flow chart of the steps used to practice the preferred embodiment of the invention.
FIG. 6 is a flow chart of additional steps used to practice another preferred embodiment of the invention.

Referring particularly to FIG. 5, the first step in practicing the present invention is to acquire monitor signal data along with the image data that is to be compensated as indicated at process block 300. The monitor data is promptly processed by first calculating the magnitude of each sample:

$$M=\sqrt{I_2+Q_2}$$

as indicated at process block 302. The phase of each monitor signal sample is then calculated:

$$\phi=\tan^{-1}(I/Q)$$

as indicated at process block 304. In the preferred embodiment the C code call to "a tan 2" is used for this calculation.

The calculated phase values $\phi$ for each of the 256 monitor signals samples are then fit to a straight line as indicated at process block 306. A weighted least squares fit subroutine is used to perform this step, where the magnitude values calculated in step 302 are used to weight the phase values. The frequency (f) of the monitor signal is then calculated as indicated at process block 308 using the slope of the straight line fit to the measured phase values:

$$f=\Delta\phi/\Delta t.$$

The frequency (f) is thus determined using a filtering function to determine the slope of the phase versus time values, using a so-called phase unwrapping method when the phase of the signal passes through the 2 π phase transition. The frequency f is the Larmor frequency of the excited spins at the polarizing magnetic field value $B_0$ at the moment the monitor signal was acquired. As indicated at process block 310, this frequency f is used to compensate the acquired image data using one of the techniques now to be described.

In one preferred embodiment of the invention the measured Larmor frequency f is used during the acquisition of subsequent image data. Referring to FIG. 2, the frequency f is output as a command to the frequency synthesizer 200 in the transceiver module 150 to control the frequency of the RF carrier signal on line 201. This carrier signal determines the center frequency of RF excitation pulses produced by subsequent imaging pulse sequences, and it determines the demodulation frequency used to acquire subsequent NMR signals. This "prospective" compensation technique corrects for variations in $B_0$ before the NMR signals are acquired. It is preferred when the separate monitor pulse sequence in FIG. 3 is employed, and the corrected carrier frequency f is used for a 50 to 100 msec period during the scan until the next monitor signal is acquired and processed. The polarizing field function $B_0(t)$ is thus measured during the scan, and the carrier frequency f is changed in such a manner that the acquired NMR image data is unaffected. The higher the rate at which $B_0(t)$ is measured, the greater the accuracy of the compensation.

If monitor signals are acquired at a high rate in order to increase compensation accuracy, it may not be reasonably possible to change the transceiver carrier frequency fast enough to implement the prospective compensation technique. In such applications the preferred compensation technique is to "retrospectively" correct the acquired k-space image data after it has been acquired.

Referring particularly to FIG. 6, the retrospective compensation technique changes the phase of the acquired k-space image data after it is acquired and stored. The first step indicated by process block 312 is to calculate the frequency error due to changes in $B_0$. This is performed by subtracting from the Larmor frequency f measured with the contemporaneously acquired NMR monitor signal a reference Larmor frequency $f_0$ produced when the polarizing magnetic field $B_0$ is at an unperturbed, reference value. The reference value is an average value over time or it can be pre-selected. The phase error produced by this frequency error $\Delta f$ is then calculated as indicated at process block 314. As indicated in FIG. 4 by the line 320, the phase error accumulates with time (t) following application of the RF excitation pulse 8. The rate of phase error accumulation, is the slope of line 320 which is determined by the frequency error $\Delta f$. The acquired echo signal 6 can be phase corrected using a single phase error correction calculated at the echo time TE, as follows:

$$\Delta\phi = \Delta f * TE.$$

In an alternative, the phase error correction can be separately calculated at each of the sample times of the NMR echo signal 6. In either case, a phase correction $-\Delta\phi$ is made to each complex (I, Q) sample of the NMR image signal 6 as indicated at process block 316. Similar corrections are made to each acquired NMR image signal in the k-space image data set using the frequency information derived from their associated NMR monitor signals. An image is then reconstructed as indicated at process block 318 using the compensated k-space data.

Many variations are possible from the preferred embodiment described above without departing from the present invention. There are other methods for measuring the frequency of the monitor signal. In the simplest method discussed above, the measurements of $B_0$ closest in time to the acquisition of NMR signal is used to correct the signal. An alternative is to fit acquired $B_0$ measurements to a low-order function such as a polynomial to provide $B_0(t)$. the value of the $B_0(t)$ function at each signal acquisition time (t) is then determined. The function $B_0(t)$ may also be calculated using a low-pass filter which has the added benefit of reducing small rapid fluctuations caused by low SNR in the monitor signals. similar filtering out of such small fluctuations can be achieved by making corrections only when the $B_0$ fluctuations exceed a threshold (e.g. 1 Hz).

What is claimed is:

1. A method for producing an image with a magnetic resonance imaging system, the steps comprising:
   a) performing a series of imaging pulse sequences in which a corresponding series of NMR image signals and NMR monitor signals are acquired;
   b) compensating the series of acquired NMR image signals for variations in a polarizing magnetic field $B_0$ in the magnetic resonance imaging system using information derived from the series of acquired NMR monitor signals; and
   c) reconstructing an image using the compensated NMR signals.

2. The method as recited in claim 1 in which the imaging pulse sequences are a gradient recalled echo pulse sequence which includes:
   i) producing an rf excitation pulse to produce transverse magnetization;
   ii) producing a phase encoding gradient pulse to impart a phase shift to the transverse magnetization; and
   iii) acquiring the NMR image signal while a readout gradient pulse is produced; and
   in which the NMR monitor signals are acquired after the rf excitation pulse is produced and prior to the production of the phase encoding and readout gradient pulses.

3. The method as recited in claim 1 in which one NMR monitor signal is acquired during each imaging pulse sequence in the series, and each NMR image signal is compensated with information derived from the NMR monitor signal acquired during the same imaging pulse sequence.

4. The method as recited in claim 1 in which the information derived from the NMR monitor signals is the frequency thereof.

5. The method as recited in claim 4 in which the frequency of each NMR monitor signal is derived by:
   i) acquiring quadrature samples of the NMR monitor signal;
   ii) calculating the phase of each quadrature sample; and
   iii) calculating the rate of change in phase of successive quadrature samples.

6. The method as recited in claim 5 in which the rate of change in phase is calculated by:
   fitting the calculated phases of successive quadrature samples to a straight line; and
   calculating the slope of the straight line.

7. The method as recited in claim 1 in which the NMR image signals are acquired by:
   i) receiving each NMR image signal;
   ii) demodulating the received NMR image signals using a carrier signal having a frequency f; and
   in which the compensation of the acquired NMR image signals is performed by altering the frequency f using information derived from an NMR monitor signal.

8. The method as recited in claim 7 in which the carrier signal frequency f is changed after each NMR monitor signal is acquired and processed to determine the frequency of the NMR monitor signal.

9. The method as recited in claim 1 in which the series of NMR image signals are acquired by quadrature sampling each NMR image signal and storing the quadrature samples in a memory; and
   in which each NMR image signal is compensated by altering the phases of the stored quadrature samples using information derived from an NMR monitor signal.

10. The method as recited in claim 9 in which the information derived from the NMR monitor signal is its rate of change in phase.

11. The method as recited in claim 10 in which each imaging pulse sequence includes producing an rf excitation pulse and at a time TE thereafter acquiring the NMR image signal; and in which the alteration of the phases of the quadrature samples is determined by the rate of change in phase of the NMR monitor signal and the time TE.

12. A magnetic resonance imaging system which comprises:
   a) means for producing a polarizing magnetic field $B_0$ throughout a region;
   b) means for producing transverse magnetization in spins located throughout the region;
   c) means for acquiring NMR signals produced by transverse magnetized spins in the region;
   d) means for producing magnetic field gradients throughout the region;
   e) a pulse generator for operating elements b), c) and d) to perform a series of imaging pulse sequences in which each imaging pulse sequence produces an NMR image signal and a corresponding NMR monitor signal;
   f) means for acquiring the series of NMR image signals and their corresponding NMR monitor signals;
   g) means for compensating the series of acquired NMR image signals for variations in the polarizing magnetic field $B_0$ using information derived from their corresponding acquired NMR monitor signal; and
   h) reconstruction means for producing an image from the compensated NMR signals.

13. The system as recited in claim 12 in which the means for compensating includes:
   means for calculating the frequency of each acquired NMR monitor signal to determine changes in the polarizing magnetic field $B_0$ that occur while the series of NMR image signals are being acquired.

14. The system as recited in claim 13 in which the means for acquiring includes a receiver which demodulates the NMR image signals using a carrier signal, and the NMR image signals are compensated by changing the frequency of this carrier signal.

15. The system as recited in claim 13 in which the means for acquiring includes a memory for storing digitized samples of the acquired NMR image signals and the NMR image signals are compensated by changing the phase of the stored digitized samples.

* * * * *